(12) United States Patent  (10) Patent No.: US 8,303,832 B2
Torres et al.  (45) Date of Patent: Nov. 6, 2012

(54) SOLID INKS FOR MASKS FOR PRINTED CIRCUIT BOARDS AND OTHER ELECTRONIC DEVICES

(75) Inventors: Francisco E. Torres, San Jose, CA (US); Norine E. Chang, Menlo Park, CA (US); Eric J. Shrader, Belmont, CA (US); C. Wayne Jaeger, Lake Oswego, OR (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 93 days.

(21) Appl. No.: 12/542,172

(22) Filed: Aug. 17, 2009

(65) Prior Publication Data

US 2011/0039194 A1    Feb. 17, 2011

(51) Int. Cl.
 *B44C 1/22* (2006.01)
(52) U.S. Cl. ............ 216/49; 216/50; 430/260; 430/263; 427/218; 427/511
(58) Field of Classification Search .................. 427/218, 427/510, 511; 216/49, 50; 430/260, 263, 430/49, 50
See application file for complete search history.

(56) References Cited

U.S. PATENT DOCUMENTS

| | | | |
|---|---|---|---|
| 3,668,131 A | 6/1972 | Banush et al. | |
| 3,715,219 A | 2/1973 | Kurz et al. | |
| 3,773,577 A | 11/1973 | Shibasaki et al. | |
| 4,130,454 A | 12/1978 | Dutkewych et al. | |
| 4,144,119 A | 3/1979 | Dutkewych et al. | |
| 4,437,931 A | 3/1984 | Elias et al. | |
| 4,849,124 A | 7/1989 | Backus | |
| 4,859,281 A | 8/1989 | Goltz | |
| 4,908,063 A | 3/1990 | Baker et al. | |
| 5,496,879 A | 3/1996 | Griebel et al. | |
| 6,547,380 B2 | 4/2003 | Smith et al. | |
| 6,872,320 B2 | 3/2005 | Wong et al. | |
| 2005/0164121 A1 | 7/2005 | Anzures et al. | |
| 2006/0112856 A1* | 6/2006 | Brychcy et al. | 106/412 |
| 2007/0120925 A1* | 5/2007 | Belelie et al. | 347/100 |
| 2008/0241712 A1 | 10/2008 | Limb et al. | |
| 2009/0088492 A1* | 4/2009 | Yokoi | 522/167 |
| 2009/0123873 A1 | 5/2009 | Shrader et al. | |
| 2010/0215865 A1* | 8/2010 | Keoshkerian et al. | 427/511 |
| 2010/0261103 A1* | 10/2010 | Sasaki et al. | 430/7 |
| 2010/0313788 A1* | 12/2010 | Drappel et al. | 106/31.29 |

FOREIGN PATENT DOCUMENTS

| | | |
|---|---|---|
| EP | 1 553 445 A2 | 7/2005 |
| EP | 1 630 600 A2 | 3/2006 |
| EP | 1630600 A2 * | 3/2006 |

OTHER PUBLICATIONS

Wikipedia, the Free Encyclopedia, "Sebacic Acid", http://en.wikipedia.org/wiki/Sebacic_acid , 2 pages, 2010.*
European Search Report for Application No. EP 10 17 2471, mailed Oct. 14, 2010.
U.S. Appl. No. 12/542,171, filed Aug. 17, 2009.

* cited by examiner

*Primary Examiner* — Binh X Tran
(74) *Attorney, Agent, or Firm* — Oliff & Berridge, PLC

(57) ABSTRACT

A printed mask derived from a composition comprised of at least one compound including at least one alkaline-hydrolyzable group, at least one compound including at least one ethylene oxide group and at least one ultraviolet radiation blocking agent, wherein the printed mask is removable using an alkaline solution in about 30 seconds or less.

25 Claims, 2 Drawing Sheets

SOLID INKS FOR MASKS FOR PRINTED CIRCUIT BOARDS AND OTHER ELECTRONIC DEVICES

CROSS-REFERENCE TO RELATED APPLICATIONS

Disclosed in commonly assigned U.S. patent application Ser. No. 12/542,171 filed Aug. 17, 2009, is a printing mask derived from a composition comprised of at least one compound including at least one alkaline-hydrolyzable group, and at least one compound including at least one ethylene oxide group, wherein the printed mask is removable using an alkaline solution in about 30 seconds or less.

The entire disclosure of the above-mentioned application is totally incorporated herein by reference.

BACKGROUND

Described herein are solid ink compositions used in printing masks for printed circuit boards.

Printed circuit boards (PCBs) or printed wiring boards (PWBs) (hereinafter collectively PCB's) are platforms that connect and interface electronic components with each other and with other elements in computers, communication devices, consumer electronics, automated manufacturing and inspection equipment. PCB's may be produced from a base of insulating material on which a thin copper layer is laminated or plated, known as a bare copper plated board, from which a chemical etching step selectively removes areas of the copper to produce electrically conducting paths or traces. The traces permit electrical interconnection of the components attached to the PCB.

An insulative material, referred to as a solder mask, is then applied over the copper conducting paths. Solder masks protect the conducting paths on the PCB from being coated with solder during the soldering step, while leaving uncovered only the conducting pads that need to be covered with molten solder. The solder mask layer on simple PCBs may be produced using screen-printing or spin-casting techniques. However, more densely populated PCBs, having generally complicated multi-layer conducting paths, typically utilize photolithography to form a patterned solder mask on the copper layer. Without the photolithographically patterned solder mask, other areas of the conducting paths could also be covered with solder and cause several problems such as short circuits by bridging solder.

During the final lithography step, an additional masking layer or "printed mask" is printed on top of the solder mask, such as those described in U.S. Pat. No. 6,872,320 and U.S. Patent Application Pub. Nos. 2005/0164121, 2008/0241712, 2009/0123873, each of which is incorporated by reference herein in their entirety. The pattern mask may be referred to as a UV mask if the pattern mask functions to block UV light from reaching the solder mask. The PCB is then exposed to UV radiation to crosslink or harden the portion(s) of the solder mask unprotected by the printed mask (the "exposed portion").

Upon exposure, the printed mask forms an "unexposed portion" of the solder mask by blocking out sufficient UV radiation from reaching the photosensitive material and thus preventing its chemical alteration. For example, UV radiation may be absorbed or reflected by one or more of UV radiation blocking agents in the composition. Subsequent to exposure, the PCB is then exposed to an aqueous base solvent, which strips or washes away both the printed mask and the "unexposed portion" of the solder mask.

While the aqueous base solvent removes some of the unexposed solder mask, such removal is often inadequate or inefficient because these solvents do not strip off solder mask and the printed mask quickly or in sufficient detail as to not require further removal effort, such as undercutting.

SUMMARY

Accordingly, the present application is directed to a solid ink composition used for a printed mask that can be removed quickly and efficiently by a suitable alkaline solvent. Such a mask would thus be suitable for all PCBs and PCB manufacturing processes using a printed mask and reduce the manufacturing costs associated with the use of more expensive masking processes.

The above and other issues are addressed by the present application, wherein in embodiments, the application relates to a printed mask derived from a composition comprised of at least one compound including at least one alkaline-hydrolyzable group, at least one compound including at least one ethylene oxide group and at least one ultraviolet radiation blocking agent, wherein the printed mask is removable using an alkaline solution in about 30 seconds or less.

In embodiments, described is a printing mask derived from a composition comprised of at least one compound including at least one alkaline-hydrolyzable group, at least one compound including at least one ethylene oxide group and at least one ultraviolet radiation blocking dye, wherein the printing mask is removable using an alkaline solution in about 30 seconds or less.

In further embodiments, described is a method of forming a pattern on a substrate, the method comprising: applying a solder mask comprised of a photosensitive material to the substrate, selectively applying a composition to the photosensitive material to form a composite structure, wherein the composition is comprised of: at least one compound including one alkaline-hydrolyzable group, at least one compound including at least one ethylene oxide group, and at least one ultraviolet radiation blocking agent, exposing the composition to ultraviolet radiation after selectively applying the composition, and applying an alkaline solution after the exposing to remove a composition and portions of the photosensitive material that are soluble in the alkaline solution in about thirty seconds or less to form the pattern on the substrate.

BRIEF DESCRIPTION OF THE DRAWINGS

Illustrated in FIGS. 1A-1D is the removal of the UV mask prepared using the compositions of Example 1 and Example 2.

Illustrated in FIGS. 2A-2D is the removal of the UV mask prepared using the compositions of Example 7 and Example 8.

EMBODIMENTS

Figure 1A:
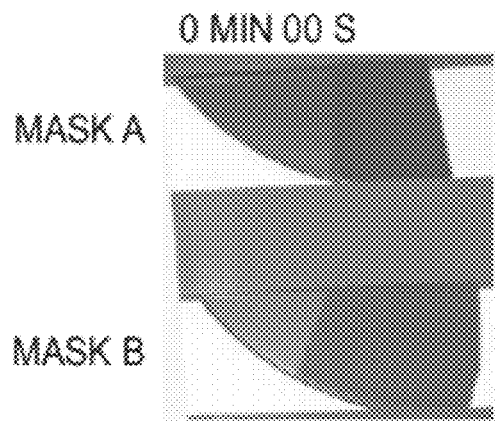

Described herein is a printed mask derived from a composition comprised of at least one compound including at least one alkaline-hydrolyzable group, at least one compound including at least one ethylene oxide group and at least one ultraviolet radiation blocking agent, wherein the printed mask is removable using an alkaline solution in about 30 seconds or less.

The compound containing at least one alkaline-hydrolyzable group may be an unsubstituted or substituted aliphatic carboxylic acid having from about 10 to about 50 carbon atoms, such as from about 14 to about 22 carbon atoms, or from about 16 to about 20 carbon atoms. Examples of suitable aliphatic carboxylic acids include saturated aliphatic carboxylic acids such as dodecanoic acid, tridecanoic acid, tetradecanoic acid, pentadecanoic acid, hexadecanoic acid (palmitic acid), heptadecanoic acid, octadecanoic acid (stearic acid), nonadecanoic acid, icosanoic acid, docosanoic acid (behenic acid), hexacosanoic acid, and tetracosanoic acid (lignoceric acid) and unsaturated aliphatic carboxylic acids such as palmitoleic acid, oleic acid, linoleic acid, linolenic acid, eicosenoic acid, eicosapentaenoic acid and cetoleic acid. Further examples include linear carboxylic acids such as UNICID carboxylic acid polymers including UNICID 350, UNICID 425, UNICID 550, and UNICID 700 (manufactured by the Baker-Petrolite Corporation). A saturated aliphatic carboxylic acid is desired to maintain the compositions stability in the heated printhead.

The composition may also comprise, alone or in combination with the above at least one compound including an alkaline-hydrolyzable group, at least one compound including two alkaline-hydrolyzable groups. Suitable examples of such a compound is a dioic acid of the formula

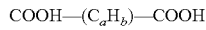

wherein a is an integer from about 5 to about 24, such as from about 10 to about 24, from about 14 to about 20 or from about 16 to about 20, and b is an integer twice the value of a. Examples of dioic acids include pimelic acid, suberic acid and a mixture of higher molecular weight acids such as CORFREE M1 (available from DuPont). A higher functionality acid such as a trioic acid may also be used. The beneficial aspects of a dioic acid include that because the alkaline base can generate two or more charge groups per molecule and the charge groups are good for dissolution/solubility, two or more acid groups per molecule will lead to faster dissolution of the printed mask.

The composition may further comprise at least one monohydric alcohol of the formula

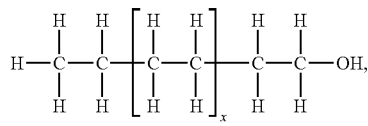

wherein x is an integer of from about 8 to about 30, such as from about 12 to about 22, or from about 14 to about 20. Examples of suitable monohydric alcohols or "fatty alcohols" include dodecanol, tridecanol, tetradecanol, pentadecanol, hexadecanol, heptadecanol, octadecanol, nonadecanol, eicosanol, heneicosanol, tricosanol, and the like.

The compound containing at least one alkaline-hydrolyzable group may be present in the composition in an amount of at least about 2% by weight of the composition, such as for example from about 2 to about 99% by weight of the composition, from about 2 to about 90% by weight of the composition, from about 3 to about 80% by weight of the composition, from about 5 to about 60% of the composition, from abut 10 to about 50% by weight of the composition, and from about 10 to about 30% by weight of the composition.

The compound including at least one ethylene oxide group may be an ethoxyated alcohol or an ester of an ethoxylated alcohol. Ethoxylated alcohols (linear) are condensation products of aliphatic alcohols and are comprised of an alkyl portion and an ethylene oxide (EO) portion. Suitable ethoxylated alcohols are also disclosed in, for example, U.S. Pat. No. 4,908,063, the disclosure of which is incorporated herein by reference in its entirety. Ethoxylated alcohols are represented by the formula:

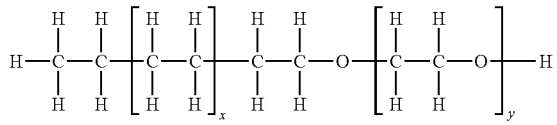

wherein x is an integer of from about 1 to about 50, such as from about 5 to about 40, from about 10 to about 30 or from about 15 to about 25 and y is an integer of from about 1 to about 70, such as from about 1 to about 50, from about 10 to about 40 or from about 1 to about 25. The materials may have a melting point of from about 60° C. to about 150° C., such as from about 70° C. to about 120° C. or from about 80° C. to about 110° C. and a number average molecular weight (Mn) range of from about 100 to about 5,000, such as from about 500 to about 3,000 or from about 500 to about 2,500. Commercial examples include UNITHOX 420 (Mn=560), UNITHOX 450 (Mn=900), UNITHOX 480 (Mn=2,250), UNITHOX 520 (Mn=700), UNITHOX 550 (Mn=1,100), UNITHOX 720 (Mn=875), UNITHOX 750 (Mn=1,400), and the like.

If the composition comprises an ethoxylated alcohol and an aliphatic carboxylic acid, the addition of the ethyoxylated alcohol disrupts the crystallinity of the composition and adds additional polar groups to aid in the strippability. For example, upon mixing the ethoxylated alcohol with the aliphatic carboxylic acid described above at a temperature of from about 100° C. to about 150° C., from about 110° C. to about 150° C. or from about 120° C. to about 130° C., the alcohol end portion of the ethoxylated alcohol reacts with carboxyl end groups of the aliphatic carboxylic acid to form an ester. This reaction disrupts the crystallinity of the composition and adds polar groups that aid in the stripping or removal of the composition with a polar alkaline solution.

Suitable ethoxylated alcohol condensation products of a higher molecular weight alcohol (for example an alcohol having at least eight carbon atoms) in a straight or branched chain configuration, condensed with about 4 to 20 moles of EO per mole of alcohol, include, for example, lauryl or myristyl alcohol condensed with about 16 moles of EO per mole of alcohol, tridecanol condensed with about 6 to 15 moles of EO per mole of alcohol, myristyl alcohol condensed with about 10 moles of EO per mole of alcohol, tallow alcohol ethoxylates containing 6 moles of EO to 11 moles of EO per mole of alcohol, and coconut fatty alcohol ethoxylates containing about 6 moles of EO to about 9 moles of EO per mole of alcohol.

Other examples of suitable ethoxylated alcohols include NEODOL ethoxylates (available from Shell Company, Tex.), which are higher aliphatic, primary alcohols containing about 9-15 carbon atoms, for example, a $C_9$-$C_{11}$ alkanol condensed with 4 to 10 moles of EO (NEODOL 91-8 or NEODOL 91-5), a $C_{12}$-$C_{13}$ alkanol condensed with 6.5 moles EO (NEODOL 23-6.5), a $C_{12}$-$C_{15}$ alkanol condensed with 12 moles EO (NEODOL 25-12), a $C_{14}$-$C_{15}$ alkanol condensed with 13 moles EO (NEODOL 45-13), a $C_{12}$ alkanol condensed with 7 moles of EO (NEODOL 1-7), a $C_9$-$C_{11}$ alkanol condensed with an average of 2.5 moles of EO (NEODOL 91-2.5), a $C_9$-$C_{11}$ alkanol condensed with 6 moles of EO (NEODOL 91-6), a $C_9$-$C_{11}$ alkanol condensed with 8 moles of EO (NEODOL 91-8), a $C_{12}$-$C_{13}$ alkanol condensed with 6.5 moles EO (NE- ODOL 23-6.5), a $C_{12}$-$C_{13}$ alkanol condensed with 7 moles EO (NEODOL 23-7), a $C_{12}$-$C_{15}$ alkanol condensed with 7 moles of EO (NEODOL 25-7), a $C_{12}$-$C_{15}$ alkanol condensed with 9 moles EO (NEODOL 25-9), a $C_{12}$-$C_{15}$ alkanol condensed with 12 moles EO (NEODOL 25-12), and a $C_{14}$-$C_{15}$ alkanol condensed with 13 moles EO (NEODOL 45-13).

Other examples of ethoxylated alcohols suitable for use are available also from Cognis Corporation under the trademark TRYCOL ST-8049, which is an ethoxylated $C_8$-$C_{10}$ alcohol with about 4 moles of EO, and also ALFONIC 810-4.5, an ethoxylated $C_8$-$C_{10}$ alcohol with 4.5 moles of EO available from Sasol Corp. Further examples of ethoxylated alcohols include the condensation products of secondary aliphatic alcohols containing 8 to 18 carbon atoms, in either a straight or branched chain configuration, condensed with 5 to 30 moles of ethylene oxide. Examples of commercially available nonionic detergents include $C_{11}$-$C_{15}$ secondary alkanol condensed with either 9 moles EO (TERGITOL 15-S-9) or 12 moles EO (TERGITOL 15-S-12) marketed by Union Carbide.

The compound containing at least one ethylene oxide group may be present in the composition in an amount of at least about 2% by weight of the composition, such as for example from about 2 to about 99% by weight of the composition, from about 2 to about 90% by weight of the composition, from about 3 to about 80% by weight of the composition, from about 5 to about 60% of the composition, from abut 10 to about 50% by weight of the composition, or from about 10 to about 30% by weight of the composition.

Any suitable ultraviolet radiation blocking agent, such as those described in U.S. Patent Application Pub. No. 2005/0164121, which is incorporated by reference herein in its entirety, may be employed to prevent photochemical alteration (for example, crosslinking) of the soldermask, while allowing the PCB of the soldermask to be photochemically altered by ultraviolet (UV) radiation. One or more of UV-blocking agents is included in the compositions such that light at wavelengths of less than 450 nm is blocked, or light of less than 400 nm is blocked, or light of from 300 nm to 450 nm is blocked. Examples of such UV-blocking agents include pigments such as inorganic pigments and organic pigments, dyes, photoinitiators, and absorbers. Synthetic and natural dyes and pigments are included as well as compounds classified under "Pigment" in the color index (C.I.; published by The Society of Dyers and Colorists Company).

Examples of inorganic pigments include, but are not limited to, iron oxides such as iron (III) oxide, zinc oxides, chromium oxides, cobalt oxides, cadmium red, barium sulfate, ultramarine blues (aluminosilicates), mixed phase titanates such as C.I. Pigment Green-Yellow PY-53, C.I. Pigment Yellow PY-53, and C.I. Pigment Red-Yellow PBr-24, mixed phase metal oxides such as C.I. Pigment Yellow PY-1 19, C.I. Pigment Brown PBr-29, and C.I. Pigment Brown PBr-31, titanium dioxides such as rutile and anatase, amber, and lead chromates. [PLEASE VERIFY THE ABOVE COMPOUNDS ARE CORRECT AND INCLUDE ANY ADDITIONAL COMPOUNDS]

Examples of organic pigments include carbon black, indigo, phthalocyanine, para red, flavanoids such as red, yellow, blue, orange and ivory colors. [PLEASE VERIFY THE ABOVE COMPOUNDS ARE SUITABLE AND INCLUDE ANY ADDITIONAL COMPOUNDS]

Specific pigment examples include pigments having color index (C.I.) numbers include C.I. Pigment Yellow 12, C.I. Pigment Yellow 13, C.I. Pigment yellow 14, C.I. Pigment Yellow 17, C.I. Pigment Yellow 20, C.I. Pigment Yellow 24, C.I. Pigment Yellow 31, C.I. Pigment Yellow 55, C.I. Pigment Yellow 83, C.I. Pigment Yellow 93, C.I. Pigment yellow 109, C.I. Pigment Yellow 110, C.I. Pigment Yellow 139, C.I. Pigment Yellow 153, C.I. Pigment Yellow 154, C.I. Pigment Yellow 166, C.I. Pigment Yellow 168, C.I. Pigment Orange 36, C.I. Pigment Orange 43, C.I. Pigment Orange 51, C.I. Pigment Red 9, C.I. Pigment Red 97, C.I. Pigment Red 122, C.I. Pigment Red 123, C.I. Pigment Red 149, C.I. Pigment Red 176, C.I. Pigment Red 177, C.I. Pigment Red 180, C.I. Pigment Red 215, C.I. Pigment Violet 19, C.I. Pigment Violet 23, C.I. Pigment Violet 29, C.I. Pigment Blue 15, C.I. Pigment Blue 15:3, C.I. Pigment Blue 15:6, C.I. Pigment Green 7, C.I. Pigment Green 36, C.I. Pigment Brown 23, C.I. Pigment Brown 25, C.I. Pigment Black 1 and C.I. Pigment Black 7. [PLEASE VERIFY THE ABOVE COMPOUNDS ARE CORRECT AND INCLUDE ANY ADDITIONAL COMPOUNDS]

Examples of organic dyes include hydrophobic dyes that include a functional group selected from the group consisting of a monoazo group, anthraquinone group, metal complex salt type monoazo group, diazo group, phthalocyanine group and triallylmethane group. These hydrophobic dyes are dissolved in many organic solvents other than water. Included are, for example, "DIARESIN YELLOW C" [Color Index (CI) Solvent Yellow 103] and "DIARESIN YELLOW A" each manufactured by Mitsubishi Chemical Co., Ltd., "ORIENT OIL SCARLET #308" [CI Solvent Red 18] manufactured by Orient Chemical bid. Co., Ltd., "AIZEN SPILON BLUE 2BNH" [CI Solvent Blue 117] and "AIZEN SPILON BLUE GNH" each manufactured by Hodogaya Chemical Ind. Co., Ltd., and "VALIFAST BLACK #3840" [CI Solvent Black 27], "VALIFAST BLACK #3850" and "VALIFAST BLACK #1802" each manufactured by Orient Chemical Ind. Co. The blend amount of the dye in the emulsion-polymerization falls in a range of 0.2 to 50% by weight based on the whole amount of the monomers.

Additional examples of the hydrophobic dye includes C.I. Solvent Yellow 1, C.I. Solvent Yellow 2, C.I. Solvent Yellow 3, C.I. Solvent Yellow 13, C.I. Solvent Yellow 14, C.I. Solvent Yellow 19, C.I. Solvent Yellow 21, C.I. Solvent Yellow 22, C.I. Solvent Yellow 29, C.I. Solvent Yellow 36, C.I. Solvent Yellow 37, C.I. Solvent Yellow 38, C.I. Solvent Yellow 39, C.I. Solvent Yellow 40, C.I. Solvent Yellow 42, C.I. Solvent Yellow 43, C.I. Solvent Yellow 44, C.I. Solvent Yellow 45, C.I. Solvent Yellow 47, C.I. Solvent Yellow 62, C.I. Solvent Yellow 63, C.I. Solvent Yellow 71, C.I. Solvent Yellow 76, C.I. Solvent Yellow 79, C.I. Solvent Yellow 81, C.I. Solvent Yellow 82, C.I. Solvent Yellow 83:1, C.I. Solvent Yellow 85, C.I. Solvent Yellow 86, C.I. Solvent Yellow 88, C.I. Solvent Yellow 151; C.I. Solvent Red 8, C.I. Solvent Red 27, C.I. Solvent Red 35, C.I. Solvent Red 36, C.I. Solvent Red 37, C.I. Solvent Red 38, C.I. Solvent Red 39, C.I. Solvent Red 40, C.I. Solvent Red 49, C.I. Solvent Red 58, C.I. Solvent Red 60, C.I. Solvent Red 65, C.I. Solvent Red 69, C.I. Solvent Red 81, C.I. Solvent Red 83:1, C.I. Solvent Red 86, C.I. Solvent Red 89, C.I. Solvent Red 91, C.I. Solvent Red 92, C.I. Solvent Red 97, C.I. Solvent Red 99, C.I. Solvent Red 100, C.I. Solvent Red 109, C.I. Solvent Red 118, C.I. Solvent Red 119, C.I. Solvent Red 122, C.I. Solvent Red 127, C.I. Solvent Red 218; C.I. Solvent Blue 14, C.I. Solvent Blue 24, C.I. Solvent Blue 25, C.I. Solvent Blue 26, C.I. Solvent Blue 34, C.I. Solvent Blue 37, C.I. Solvent Blue 38, C.I. Solvent Blue 39, C.I. Solvent Blue 42, C.I. Solvent Blue 43, C.I. Solvent Blue 44, C.I. Solvent Blue 45, C.I. Solvent Blue 48, C.I. Solvent Blue 52, C.I. Solvent Blue 53, C.I. Solvent Blue 55, C.I. Solvent Blue 59, C.I. Solvent Blue 67, C.I. Solvent Blue 70; C.I. Solvent Black 3, C.I. Solvent Black 5, C.I. Solvent Black 7, C.I. Solvent Black 8, C.I. Solvent Black 14, C.I. Solvent Black 17, C.I. Solvent Black 19, C.I. Solvent Black 20, C.I. Solvent Black 22, C.I. Solvent Black 24, C.I. Solvent Black 26, C.I. Solvent Black 28, C.I. Solvent Black 29, C.I. Solvent Black 43, C.I. Solvent Black 45.

UV absorbers include benzophenones and derivatives such as hydroxybenzophenones, benzotriazoles and derivatives such as benzotriazole carboxylic acids, triazines such as s-triazines, benzoates such as octyl-p-dimethylaminobenzoate, cinnamates such as octylmethoxycinnamate, salicylates such as octylsalicylate, crylenes such as octocrylene, cyanoacrylates such as 2-ethylhexyl 2-cyano-3,3-diphenylacrylate, malonates, oxanilides, 2-cyanoacrylates, and formamidines.

Specific examples of UV absorbers include (1) 2-bromo-2',4-dimethoxyacetophenone (Aldrich 19,948-6), (2) 2-bromo-2',5'-dimethoxyacetophenone (Aldrich 10,458-2), (3) 2-bromo-3'-nitroacetophenone (Aldrich 34,421-4), (4) 2-bromo-4'-nitroacetophenone (Aldrich 24,561-5), (5) 3',5'-diacetoxyacetophenone (Aldrich 11,738-2), (6) 2-phenylsulfonyl acetophenone (Aldrich 34,150-3), (7) 3'-aminoacetophenone (Aldrich 13,935-1), (8) 4'-aminoacetophenone (Aldrich A3,800-2), (9) 1H-benzotriazole-1-acetonitrile (Aldrich 46,752-9), (10) 2-(2H-benzotriazol-2-yl)-4,6-di-tert-pentylphenol (Aldrich 42,274-6), (11)1,1-(1,2-ethane-diyl) bis(3,3,5,5-tetramethylpiperazinone) (commercially available from Goodrich Chemicals), (12) 2,2,4-trimethyl-1,2-hydroquinoline (commercially available from Mobay Chemical), (13) 2-(4-benzoyl-3-hydroxy phenoxy)ethylacrylate, (14) 2-dodecyl-N-(1,2,2,6,6-pentamethyl-4-piperidinyl) succinimide (commercially available from Aldrich Chemical Co., Milwaukee, Wis.), (15) 2,2,6,6-tetramethyl-4-piperidinyl/β-tetramethyl-3,9-(2,4,8,10-tetraoxo spiro(5,5)-undecane)diethyl-1,2,3,4-butane tetracarboxylate (commercially available from Fairmount), (16) N-(p-ethoxycarbonylphenyl)-N'-ethyl-N'-phenylformadine (commercially available from Givaudan), (17) 6-ethoxy-1,2-dihydro-2,2,4-trimethylquinoline (commercially available from Monsanto Chemicals), (18) 2,4,6-tris-(N-1,4-dimethyl-pentyl-4-phenylenediamino)-1,3,5-triazine (commercially available from Uniroyal), (19) 2-dodecyl-N-(2,2,6,6-tetrame-thyl-4-piperidinyl) succinimide (commercially available from Aldrich Chemical Co.), (20) N-(1-acetyl-2,2,6,6-tetramethyl-4-piperidinyl)-2-dodecyl succinimide (commercially available from Aldrich Chemical Co.), (21) (1,2,2,6,6-pentamethyl-4-piperidinyl/β-tetramethyl-3,9-(2,4,8,10-tetra oxo-spiro-(5,5)undecane)diethyl)-1,2,3,4-butane tetracarboxylate (commercially available from Fairmount), (22) (2,2,6,6-tetramethyl-4-piperidinyl)-1,2,3,4-butane tetracarboxylate (commercially available from Fairmount), (23) nickel dibutyl dithio carbamate (commercially available as UV-Chek AM-105 from Ferro), (24) 2-amino-2',5-dichlorobenzophenone (Aldrich 10,515-5), (25) 2'-amino-4',5'-dimethoxyacetophenone (Aldrich 32,922-3), (26) 2-benzyl-2-(dimethylamino)-4'-morpholino butyrophenone (Aldrich 40,564-7), (27) 4'-benzyloxy-2'-hydroxy-3'-methylacetophenone (Aldrich 29,884-0), (28) 4,4'-bis(diethylamino)benzophenone (Aldrich 16,032-6), (29) 5-chloro-2-hydroxy benzophenone (Aldrich C4,470-2), (30) 4'-piperazinoacetophenone (Aldrich 13,646-8), (31) 4'-piperidinoacetophenone (Aldrich 11,972-5), (32) 2-amino-5-chlorobenzophenone (Aldrich A4,556-4), (33) 3,6-bis(2-methyl-2-morpholinopropionyl)-9-octylearbazole (Aldrich 46,073-7), and the like, as well as mixtures thereof.

Additional examples of the UV absorber include TINUVIN PS, TINUVIN P, TINUVIN 99-2, TINUVIN 109, TINUVIN 213, TINUVIN 234, TINUVIN 326, TINUVIN 328, TINUVIN 329, TINUVIN 384-2, TINUVIN 571, TINUVIN 900, TINUVIN 928, TINUVIN 1130, TINUVIN 400, TINUVIN 405, TINUVIN 460, TINUVIN 479 TINUVIN 5236, ADK STAB LA32, ADK STAB LA-34, ADK STAB LA-36, ADK STAB LA-31, ADK STAB 1413 and ADK STAB LA-51. TINUVIN is a trade name of a commercial product available from Ciba Specialty Chemicals Co., Ltd.

One or more such ultraviolet-blocking agents are included in the composition printing mask in amounts such as from about 0.1 wt % to about 50 wt %, such as from 1 wt % to about 30 wt %, from about 2 wt % to about 20 wt %, from about 2 wt % to about 10 wt %, and from about 4 wt % to about 8 wt % of the composition.

In embodiments, the composition may further comprise at least one additive selected from the group consisting of a plasticizer, a tackifier, a polyamide resin, biocide, antioxidant, adhesive, and the like.

Plasticizers may be selected from the group consisting of UNIPLEX 250 (commercially available from Uniplex), the phthalate ester plasticizers commercially available from Monsanto under the trade name SANTICIZER, such as dioctyl phthalate, diundecyl phthalate, alkylbenzyl phthalate (SANTICIZER 278), triphenyl phosphate (commercially available from Monsanto), KP-140, a tributoxyethyl phosphate (commercially available from FMC Corporation), MORFLEX 150, a dicyclohexyl phthalate (commercially available from Morflex Chemical Company Inc.), trioctyl trimellitate (commercially available from Eastman Kodak Co.), and the like. Plasticizers may be present in an amount from about 0.01 percent by weight of the composition to from about 98 percent by weight of the composition, from about 0.1 percent by weight of the composition to about 50 percent by weight of the composition, from about 5 weight percent of the composition to about 10 weight percent of the composition.

The composition may further contain a tackifier selected from the group consisting of FORAL 85, a glycerol ester of hydrogenated abietic (rosin) acid (commercially available from Hercules), FORAL 105, a pentaerythritol ester of hydroabietic (rosin) acid (commercially available from Hercules), CELLOLYN 21, a hydroabietic (rosin) alcohol ester of phthalic acid (commercially available from Hercules), ARAKAWA KE-311 and KE-100 Resins, triglycerides of hydrogenated abietic (rosin) acid (commercially available from Arakawa Chemical Industries, Ltd.), synthetic polyterpene resins such as NEVTAC 2300, NEVTAC 100, and NEVTACO 80 (commercially available from Neville Chemical Company), WINGTACK 86, a modified synthetic polyterpene resin (commercially available from Goodyear), and the like. Tackifiers may be present in the composition in any effective amount, such as from about 0.01 percent by weight of the composition to from about 50 percent by weight of the composition, from about 0.1 percent by weight of the composition to about 20 percent by weight of the composition or from about 5 weight percent of the composition to about 10 weight percent of the composition.

In embodiments, the composition may further comprise a suitable polyamide resin to tackify or increase the viscosity of the composition, or increase the solubility of at least one of the other components in the composition. Examples of suitable polyamide resins include polyesteramide resins of weight average molecular weight of less than 15,000 g/mole, available from Arizona Chemical and sold under the tradename UNIREZ, such as, for example, such as UNIREZ 2970, UNIREZ 2974 and UNIREZ 2980. These resins have a softening point from about 90° C. to about 140° C. and a viscosity at 130° C. between about 20 to about 150 cP.

Biocides may be present in amounts of from about 0.1 to about 1.0 percent by weight of the composition. Suitable biocides include, for example, sorbic acid, 1-(3-chloroallyl)-3,5,7-triaza-1-azoniaadamantane chloride, commercially available as DOWICIL 200 (Dow Chemical Company), vinylene-bis thiocyanate, commercially available as CYTOX 3711 (American Cyanamid Company), disodium ethylenebis-dithiocarbamate, commercially available as DITHONE D14 (Rohm & Haas Company), bis(trichloromethyl)sulfone, commercially available as BIOCIDE N-1386 (Stauffer Chemical Company), zinc pyridinethione, commercially available as zinc omadine (Olin Corporation), 2-bromo-t-nitropropane-1,3-diol, commercially available as ONYXIDE 500 (Onyx Chemical Company), BOSQUAT MB50 (Louza, Inc.), and the like.

The composition may contain antioxidants to protect the composition components from oxidation while existing as a heated melt in the reservoir. Examples of suitable antioxidants include (1) N,N'-hexamethylene bis(3,5-di-tert-butyl-4-hydroxy hydrocinnamamide) (IRGANOX 1098, available from Ciba-Geigy Corporation), (2) 2,2-bis(4-(2-(3,5-di-tert-butyl-4-hydroxyhydrocinnamoyloxy))ethoxyphenyl)propane (TOPANOL-205, available from ICI America Corporation), (3) tris(4-tert-butyl-3-hydroxy-2,6-dimethyl benzyl) isocyanurate (CYANOX 1790, 41,322-4, LTDP, Aldrich D12, 840-6), (4) 2,2'-ethylidene bis(4,6-di-tert-butylphenyl)fluoro phosphonite (ETHANOX-398, available from Ethyl Corporation), (5) tetrakis(2,4-di-tert-butylphenyl)-4,4'-biphenyl diphosphonite (ALDRICH 46,852-5; hardness value 90), (6) pentaerythritol tetrastearate (TCI America #PO739), (7) tributylammonium hypophosphite (Aldrich 42,009-3), (8) 2,6-di-tert-butyl-4-methoxyphenol (Aldrich 25,106-2), (9) 2,4-di-tert-butyl-6-(4-methoxybenzyl)phenol (Aldrich 23,008-1), (10) 4-bromo-2,6-dimethylphenol (Aldrich 34,951-8), (11) 4-bromo-3,5-didimethylphenol (Aldrich B6,420-2), (12) 4-bromo-2-nitrophenol (Aldrich 30,987-7), (13) 4-(diethyl aminomethyl)-2,5-dimethylphenol (Aldrich 14,668-4), (14) 3-dimethylaminophenol (Aldrich D14,400-2), (15) 2-amino-4-tert-amylphenol (Aldrich 41,258-9), (16) 2,6-bis(hydroxymethyl)-p-cresol (Aldrich 22,752-8), (17) 2,2'-methylenediphenol (Aldrich B4,680-8), (18) 5-(diethylamino)-2-nitrosophenol (Aldrich 26,951-4), (19) 2,6-dichloro-4-fluorophenol (Aldrich 28,435-1), (20) 2,6-dibromo fluoro phenol (Aldrich 26,003-7), (21) α-trifluoro-o-cresol (Aldrich 21,979-7), (22) 2-bromo-4-fluorophenol (Aldrich 30,246-5), (23) 4-fluorophenol (Aldrich F1,320-7), (24) 4-chlorophenyl-2-chloro-1,1,2-tri-fluoroethyl sulfone (Aldrich 13,823-1), (25) 3,4-difluoro phenylacetic acid (Aldrich 29,043-2), (26) 3-fluorophenylacetic acid (Aldrich 24,804-5), (27) 3,5-difluoro phenylacetic acid (Aldrich 29,044-0), (28) 2-fluorophenylacetic acid (Aldrich 20,894-9), (29) 2,5-bis(trifluoromethyl)benzoic acid (Aldrich 32,527-9), (30) ethyl-2-(4-(4-(trifluoromethyl)phenoxy)phenoxy)propionate (Aldrich 25,074-0), (31) tetrakis (2,4-di-tert-butyl phenyl)-4,4'-biphenyl diphosphonite (Aldrich 46,852-5), (32) 4-tert-amyl phenol (Aldrich 15,384-2), (33) 3-(2H-benzotriazol-2-yl)-4-hydroxy phenethylalcohol (Aldrich 43,071-4), NAUGARD 76, NAUGARD 445, NAUGARD 512, and NAUGARD 524 (manufactured by Uniroyal Chemical Company), and the like, as well as mixtures thereof. The antioxidant, when present, may be present in the composition in any desired or effective amount, such as from about 0.25 percent to about 10 percent by weight of the composition or from about 1 percent to about 5 percent by weight of the composition.

Adhesives, such as VERSAMID 757, 759, or 744 (commercially available from Henkel) may be present in the composition from about 0.01 percent by weight of the composition to from about 98 percent by weight of the composition, from about 0.1 percent by weight of the composition to about 50 percent by weight of the composition, from about 5 weight percent of the composition to about 10 weight percent of the composition.

When present, the additives may each, or in combination, be present in the composition in any desired or effective amount, such as from about 1 percent to about 10 percent by weight of the composition or from about 3 percent to about 5 percent by weight of the composition.

The composition herein may be function in a similar manner to a phase change ink. Phase change inks (sometimes referred to as "solid inks" and "hot melt inks") have been used in various liquid deposition techniques. Phase change inks often contain a "phase change agent" that enables the ink to exist in a solid phase at ambient temperatures, but also exist in the liquid phase at the elevated operating temperature of an ink jet printing device At the deposit operating temperature, droplets of liquid ink are ejected from the printing device and, as the ink is jetted towards or contacts the surface of the recording substrate, either directly or via an intermediate heated transfer belt or drum, the ink quickly solidifies to form a predetermined pattern of solidified ink drops. Phase change inks have also been used in other printing technologies, such as gravure printing, as disclosed in, for example, U.S. Pat. No. 5,496,879 the disclosure which is incorporated herein by reference.

In general, the composition is in the solid phase at, for example, ambient or room temperature, such as about 20° C. to about 27° C., but exist in the liquid phase at the elevated operating temperature of an ink jet printing device. At the jet operating temperature, the ink is molten and droplets of liquid ink are ejected from the printing device.

In embodiments, the composition may have a melting point of from about 40° C. to about 85° C., for example from about 40° C. to about 65° C., from about 40° C. to about 60° C., from about 45° C. to about 55° C. or from about 45° C. to about as determined by, for example, observation and measurement on a microscope hot stage, wherein the composition is heated on a glass slide and observed by microscope, or characterized by differential scanning calorimetry. Furthermore, the composition may have a jetting viscosity of about 5 cP to about 25 cP.

In embodiments, the composition may be employed as a UV printed mask in methods for forming an image on a substrate and be selectively applied to a substrate coated with a photosensitive material. More specifically, the composition may be selectively deposited as a liquid on a solder mask to form a printed mask composition on the surface of the solder mask such that the printed mask defines a pattern on the solder mask, the solder mask covering the circuit traces in the final article.

The phrases "selectively deposit" or "selective deposition" refers to, for example, deposition of the printed mask composition using a liquid process such as liquid coating or printing, where the liquid is the melted printed mask composition. Any suitable process or device may be employed to selectively deposit the liquid printed mask composition in a pattern to the solder mask. The printed mask composition may be referred to as an ink when printing is used. Examples of liquid coating processes may include, for example, spin coating, blade coating, rod coating, dip coating, and the like. Examples of printing techniques may include, for example, lithography or offset printing, gravure, flexography, screen printing, stencil printing, ink jet printing, stamping (such as microcontact printing), and the like. Ink jet printing devices such as those described in U.S. Pat. No. 6,547,380, incorporated herein by reference in its entirety, are known in the art, and thus extensive description is not required herein. Selective deposition deposits a layer of the printed mask composition having a thickness ranging from about 1 nanometers to about 5 millimeters, from about 10 nanometers to about 1000 micrometers, from about 1 micrometer to about 100 micrometers and from about 25 micrometers to about 50 micrometers.

After the printed mask composition is applied to the substrate, UV radiation may then be applied to the composite, which includes the substrate, solder mask and the UV mask. Upon exposure to the UV radiation, the portion of the solder mask (containing a photosensitive material) that is left uncovered by the UV mask (the exposed portion) is chemically altered. An example of the chemical alteration may include crosslinking and/or hardening of the unexposed portion of the solder mask.

The printed mask and the unexposed portion of the solder mask may then be removed or "stripped" in less than about 30 seconds with an alkaline solution (aqueous base). The UV mask is thus removable in about 30 seconds or less. Suitable alkaline solutions have pH ranges of from 7.5 to 14, or such as from 8 to 13, or such as from 9 to 12. The alkaline solution is comprised of an alkali solute dissociated in water. Examples of suitable alkaline solutions include alkali metal hydroxides, such as, for example, sodium hydroxide and potassium hydroxide, and alkali metal carbonates such as sodium carbonate and potassium carbonate. The amount of solute may be present in the alkaline solution from about 0.05 percent by weight of the alkaline solution to from about 5 percent by weight of the alkaline solution, from about 0.1 percent by weight of the alkaline solution to about 4 percent by weight of the alkaline solution, from about 1 weight percent of the alkaline solution to about 2 weight percent of the alkaline solution.

EXAMPLES

Example 1

Preparation of a UV Mask Composition A

A UV mask composition was prepared by forming a mixture comprised of 63.75 parts by weight of hexadecanoic acid (palmitic acid), 63.75 parts by weight of octadecanoic acid (stearic acid), and 63.75 parts by weight of docosanoic acid (behenic acid). The docosanoic acid was premelted overnight at 110° C. in a stainless steel beaker before being added to the mixture. After mixing, the mixture was maintained at a temperature between 103° C. and 122° C. with a stirring lobe impeller at 445 RPM. 50.00 parts by weight of UNITHOX 450 (an ethoxylated alcohol) were then added to the mixture. Two hours later, 8.75 parts by weight of Valifast 3840L dye were sifted into the mixture over a period of about 30 minutes. The temperature of the mixture was then held constant at 119° C. and stirred continuously for the next 90 minutes. After stirring, the resulting mixture was pressure-filtered, with about 5 grams of diatomaceous earth added, through a Whatman No. 3 filter paper.

Example 2

Preparation of a UV Mask Composition B

A UV mask composition was prepared by mixing 66.53 parts of UNICID 350 by weight) with 66.53 parts by weight of hexadecanoic acid (palmitic acid), and 66.53 parts by weight of octadecanoic acid (stearic acid) premelted overnight at 110° C. in a stainless steel beaker. The mixture was then maintained at a temperature between 103 and 122° C. with a stirring lobe impeller at 445 RPM. 41.67 parts by weight of UNITHOX 450 (an ethoxylated alcohol) were then added to the mixture. Two hours later, 8.75 parts by weight of Valifast 3840L dye were sifted into the mixture over a period of about 30 minutes. The temperature of the mixture was then held constant at 120° C. and stirred continuously for the next 70 minutes. After mixing, the mixture was pressure-filtered, with about 5 grams of diatomaceous earth added, through a Whatman No. 3 filter paper.

Example 3

Strippability of UV Mask A

Figure 1B:
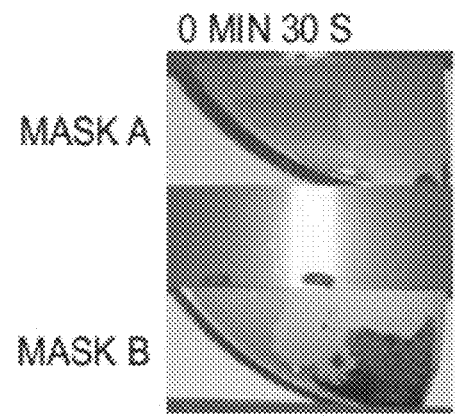
Figure 1C:
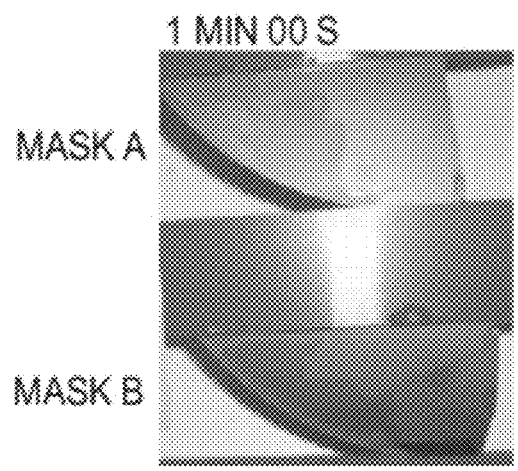
Figure 1D:
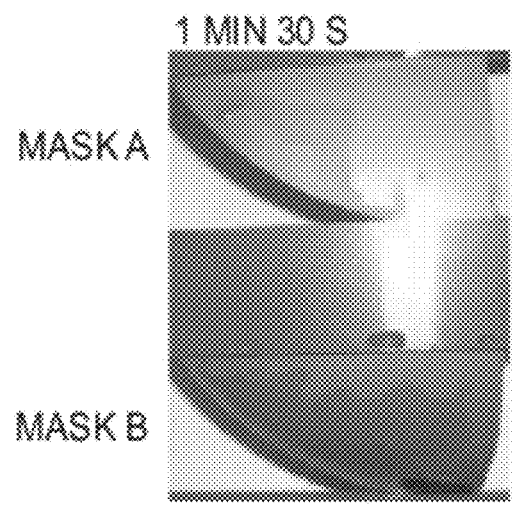

A silicon wafer coated with cured soldermask was diced into fragments and dipcoated into molten UV Mask Composition A such that UV Mask A, with a thickness greater than or equal to 25 um, was formed on the cured soldermask. UV Mask A was stripped away by applying an alkaline base solution (50° C.) comprising 1.2 weight percent potassium carbonate dissolved in water with a Rotaspray apparatus. As shown in FIGS. 1A-1D, a significant portion of the UV mask was removed in 30 seconds. The substrate was then driprinsed for 10 seconds with deionized water.

Example 4

Strippability of UV Mask B

A silicon wafer coated with cured soldermask was diced into fragments and dipcoated into molten UV Mask Composition B such that UV Mask B, with a thickness greater than or equal to 25 um, was formed on the cured soldermask. UV Mask B was stripped away by applying an alkaline base solution (50° C.) comprising 1.2 weight percent potassium carbonate dissolved in water with a Rotaspray apparatus. As shown in FIGS. 1A-1D, a significant portion of the UV mask was removed in 30 seconds. The substrate was then driprinsed for 10 seconds with deionized water.

Example 5

Preparation of UV Mask Composition C

A UV mask composition was prepared by forming a mixture comprised of 63.75 parts by weight of hexadecanoic acid (palmitic acid), 63.75 parts by weight of octadecanoic acid (stearic acid), and 63.75 parts by weight of docosanoic acid (behenic acid) premelted overnight at 110° C. in a stainless steel beaker. The mixture was then maintained at a temperature between 103° C. and 122° C. with a stirring lobe impeller at 445 RPM. 50.00 parts by weight of UNITHOX 450 (an ethoxylated alcohol) were then added to the mixture. Half an hour later, 8.77 parts by weight of Solvent Black 3 dye were sifted into the mixture over a period of about 10 minutes. The temperature of the mixture was then held constant at 115° C. and stirred continuously for about 60 minutes. After mixing, the mixture was pressure-filtered, with about 8 g of diatomaceous earth added, through a Whatman No. 3 filter paper.

Example 6

Preparation of Composition D

A composition was then prepared by mixing UNICID 350 (66.53 parts) with 66.53 parts by weight of hexadecanoic acid (palmitic acid), and 66.53 parts by weight of octadecanoic acid (stearic acid) premelted at overnight at 110° C. in a stainless steel beaker. 41.67 parts by weight of UNITHOX 450 (an ethoxylated alcohol) were then added to the mixture, which was then maintained at a temperature between 103° C. and 122° C. with a stirring lobe impeller at 445 RPM. Two hours later, 8.77 parts by weight of Solvent Black 3 dye were sifted in over a period of about 3 minutes. The temperature of the mixture was then held between 103 and 122° C. and stirred continuously for about 2 h. After mixing, the mixture was pressure-filtered, with about 8 g of diatomaceous earth added, through a Whatman No. 3 filter paper.

Example 7

Strippability of UV Mask C

Figure 2A:
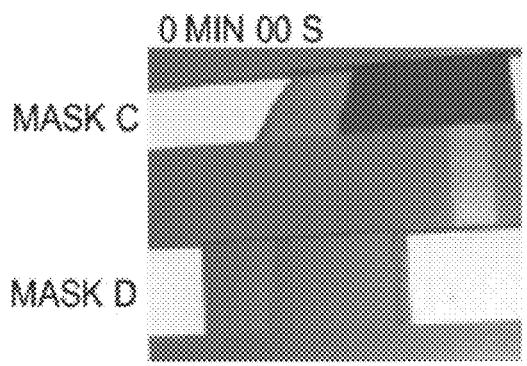
Figure 2B:
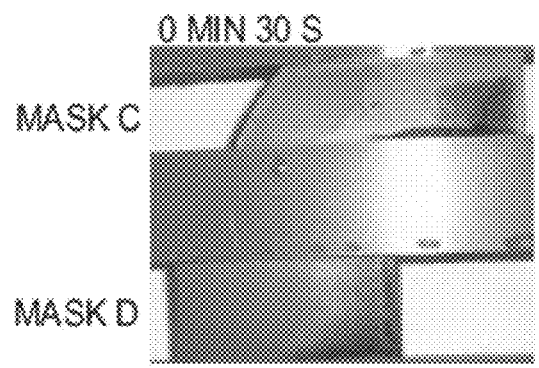
Figure 2C:
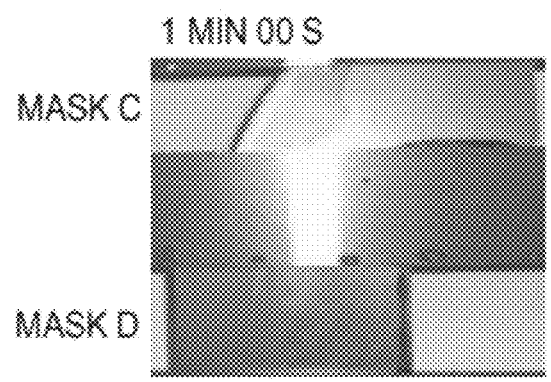
Figure 2D:
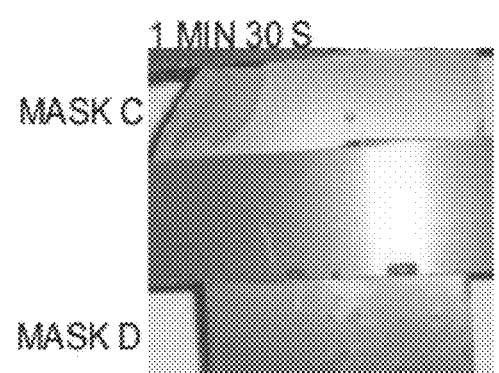

A silicon wafer coated with cured soldermask was diced into fragments and dipcoated into molten UV Mask Composition C such that UV Mask C, with a thickness greater than or equal to 25 um, was formed on the cured soldermask. UV Mask C was stripped away by applying an alkaline base solution (50° C.) comprised 1.2 weight percent potassium carbonate dissolved in water with a Rotaspray apparatus. As shown in FIGS. 2A-2D, a significant portion of the UV mask was removed in 30 seconds. The substrate was then driprinsed for 10 seconds with deionized water.

Example 8

Strippability of UV Mask D

A silicon wafer coated with cured soldermask was diced into fragments and dipcoated into molten UV Mask Composition D such that UV Mask D, with a thickness greater than or equal to 25 um, was formed on the cured soldermask. UV Mask D was stripped away by applying an alkaline base solution (50° C.) comprised 1.2 weight percent potassium carbonate dissolved in water with a Rotaspray apparatus. As shown in FIGS. 2A-2D, a significant portion of the UV mask was removed in 30 seconds. The substrate was then driprinsed for 10 seconds with deionized water.

It will be appreciated that various of the above-disclosed and other features and functions, or alternatives thereof, may be desirably combined into many other different systems or applications. Also, various presently unforeseen or unanticipated alternatives, modifications, variations or improvements therein may be subsequently made by those skilled in the art, and are also intended to be encompassed by the following claims.

What is claimed is:

1. A printed mask derived from a composition comprised of at least one compound including at least one alkaline-hydrolyzable group, at least one compound including at least one ethylene oxide group and at least one ultraviolet radiation blocking agent,
wherein the printed mask is removable using an alkaline solution in about 30 seconds or less, and
wherein the compound including the at least one alkaline-hydrolyzable group is selected from the group consisting of dodecanoic acid, tridecanoic acid, tetradecanoic acid, pentadecanoic acid, hexadecanoic acid (palmitic acid), heptadecanoic acid, octadecanoic acid (stearic acid), nonadecanoic acid, icosanoic acid, docosanoic acid (behenic acid), hexacosanoic acid, tetracosanoic acid (lignoceric acid), palmitoleic acid, oleic acid, linoleic acid, linolenic acid, eicosenoic acid, eicosapentaenoic acid and cetoleic acid.

2. The printed mask of claim 1, wherein the composition further comprises at least one alcohol of the formula

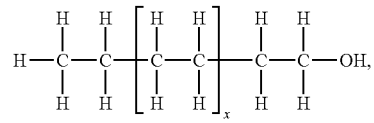

wherein x is an integer of from about 8 to about 30.

3. The printed mask of claim 1, wherein the at least one compound including the at least one ethylene oxide group is an ethoxylated alcohol of the formula

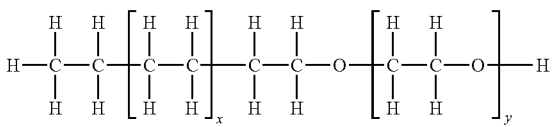

wherein x is an integer of from about 1 to about 50 and y is an integer of from about 1 to about 70.

4. The printed mask of claim 1, wherein the at least one compound including ethylene oxide groups is present in the composition in an amount of at least 0.5 percent by weight of composition to about 50 percent by weight of the composition.

5. The printed mask of claim 1, wherein the composition has a melting point of about 40° C. to about 65° C.

6. The printed mask of claim 1, wherein the composition further comprises at least one additive selected from the group consisting of a plasticizer, a tackifier, a polyamide resin, a biocide, an antioxidant and adhesive.

7. The printed mask of claim 1, wherein the at least one ultraviolet blocking agent is selected from the group consisting of a pigment, a dye, a photoinitiator and an absorber.

8. The printed mask of claim 1, wherein the compound including the at least one alkaline-hydrolyzable group is selected from the group consisting of dodecanoic acid, tridecanoic acid, pentadecanoic acid, nonadecanoic acid, palmitoleic acid, oleic acid, linoleic acid, linolenic acid, eicosenoic acid, and cetoleic acid.

9. The printed mask of claim 1, wherein the compound including the at least one alkaline-hydrolyzable group is selected from the group consisting of palmitoleic acid, oleic acid, linoleic acid, eicosenoic acid, and cetoleic acid.

10. The printed mask of claim 1, wherein the at least one compound including the at least one ethylene oxide group is an ethoxylated alcohol of the formula

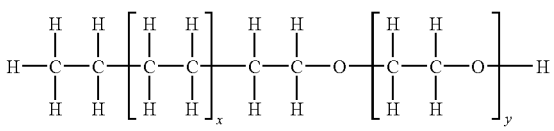

wherein x is an integer of from about 5 to about 40 and y is an integer of from about 1 to about 50.

11. The printed mask of claim 10, wherein the ethoxylated alcohol is comprised of about four ethylene oxide groups to about ten ethylene oxide groups per molecule of the ethoxylated alcohol.

12. A printed mask derived from a composition comprised of at least one compound including at least one alkaline-hydrolyzable group, at least one compound including at least one ethylene oxide group and at least one dye,
   wherein the printing mask is removable using an alkaline solution in about 30 seconds or less, and
   wherein the compound including the at least one alkaline-hydrolyzable group is selected from the group consisting of dodecanoic acid, tridecanoic acid, tetradecanoic acid, pentadecanoic acid, hexadecanoic acid (palmitic acid), heptadecanoic acid, octadecanoic acid (stearic acid), nonadecanoic acid, icosanoic acid, docosanoic acid (behenic acid), hexacosanoic acid, tetracosanoic acid (lignoceric acid), palmitoleic acid, oleic acid, linoleic acid, linolenic acid, eicosenoic acid, eicosapentaenoic acid and cetoleic acid.

13. The printed mask of claim 12, wherein the composition further comprises at least one alcohol of the formula

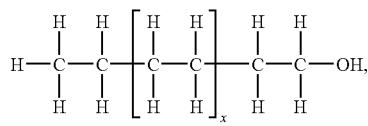

wherein x is an integer of from about 8 to about 30.

14. The printed mask of claim 12, wherein the at least one compound including the at least one ethylene oxide group is an ethoxylated alcohol of the formula

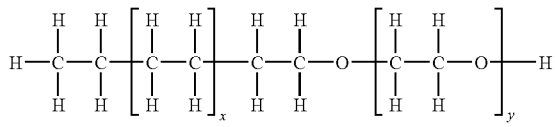

wherein x is an integer of from about 5 to about 40 and y is an integer of from about 1 to about 50.

15. The printed mask of claim 12, wherein the at least one compound including ethylene oxide groups is present in the composition in an amount of at least 0.5 percent by weight of composition to about 50 percent by weight of the composition.

16. The printed mask of claim 12, wherein the composition has a melting point of about 40° C. to about 65° C.

17. The printed mask of claim 12, wherein the dye is a hydrophobic dye that includes a functional group selected from the group consisting of monoazo group, anthraquinone group, metal complex salt type monoazo group, diazo group, phthalocyanine group and triallylmethane group.

18. The printed mask of claim 12, wherein the compound including the at least one alkaline-hydrolyzable group is selected from the group consisting of dodecanoic acid, tridecanoic acid, pentadecanoic acid, nonadecanoic acid, palmitoleic acid, oleic acid, linoleic acid, linolenic acid, eicosenoic acid, and cetoleic acid.

19. The printed mask of claim 12, wherein the compound including the at least one alkaline-hydrolyzable group is selected from the group consisting of palmitoleic acid, oleic acid, linoleic acid, eicosenoic acid, and cetoleic acid.

20. The printed mask of claim 12, wherein the at least one compound including the at least one ethylene oxide group is an ethoxylated alcohol of the formula

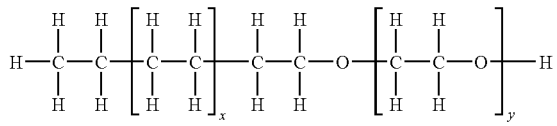

wherein x is an integer of from about 1 to about 50 and y is an integer of from about 1 to about 70.

21. The printed mask of claim 20, wherein the ethoxylated alcohol is comprised of about four ethylene oxide groups to about ten ethylene oxide groups per molecule of the ethoxylated alcohol.

22. The printed mask of claim 20, wherein the ethoxylated alcohol is comprised of four ethylene oxide groups and is present in the composition in an amount of about 45 percent by weight to about 50 percent by weight.

23. A method of forming a pattern on a substrate, the method comprising:
   applying a solder mask comprised of a photosensitive material to the substrate,
   selectively applying a composition to the photosensitive material to form a composite structure, wherein the composition is comprised of:
      at least one compound including at least one alkaline-hydrolyzable group, at least one compound including at least one ethylene oxide group, and at least one ultraviolet radiation blocking agent,
   exposing the composition to ultraviolet radiation after the selectively applying the composition, and
   applying an alkaline solution after the exposing to remove a composition and portions of the photosensitive material that are soluble in the alkaline solution in about thirty seconds or less to form the pattern on the substrate, and
   wherein the compound including the at least one alkaline-hydrolyzable group is selected from the group consisting of dodecanoic acid, tridecanoic acid, tetradecanoic acid, pentadecanoic acid, hexadecanoic acid (palmitic acid), heptadecanoic acid, octadecanoic acid (stearic acid), nonadecanoic acid, icosanoic acid, docosanoic acid (behenic acid), hexacosanoic acid, tetracosanoic acid (lignoceric acid), palmitoleic acid, oleic acid, linoleic acid, linolenic acid, eicosenoic acid, eicosapentaenoic acid and cetoleic acid.

24. The method of claim 23, wherein the alkaline solution is an alkali hydroxide or alkali carbonate solution.

25. The method of claim 23, wherein the composition is selectively applied to the photosensitive material by an ink jet device.

* * * * *